United States Patent
Rottstegge et al.

(10) Patent No.: US 6,893,972 B2
(45) Date of Patent: May 17, 2005

(54) PROCESS FOR SIDEWALL AMPLIFICATION OF RESIST STRUCTURES AND FOR THE PRODUCTION OF STRUCTURES HAVING REDUCED STRUCTURE SIZE

(75) Inventors: Jörg Rottstegge, Lilienthal (DE); Eberhard Kühn, Hemhofen (DE); Waltraud Herbst, Uttenreuth (DE); Christian Eschbaumer, Schwaig (DE); Christoph Hohle, Bubenreuth (DE); Gertrud Falk, Erlangen (DE); Michael Sebald, Weisendorf (DE)

(73) Assignee: Infineon Technologies AG, Munich (DE)

( * ) Notice: Subject to any disclaimer, the term of this patent is extended or adjusted under 35 U.S.C. 154(b) by 199 days.

(21) Appl. No.: 10/233,694

(22) Filed: Sep. 3, 2002

(65) Prior Publication Data

US 2003/0091936 A1 May 15, 2003

(30) Foreign Application Priority Data

Aug. 31, 2001 (DE) .......................................... 101 42 590

(51) Int. Cl.[7] .................. H01L 21/302; H01L 21/3065; G03C 1/73; C03C 15/00
(52) U.S. Cl. ...................... 438/706; 438/725; 430/323; 430/325; 216/16; 216/67
(58) Field of Search ................................ 438/706, 725; 430/323, 325; 216/16; 261/67

(56) References Cited

U.S. PATENT DOCUMENTS

| | | | |
|---|---|---|---|
| 4,491,628 A | 1/1985 | Ito et al. ..................... 430/176 |
| 5,234,793 A | 8/1993 | Sebald et al. ................ 430/323 |
| 5,234,794 A | 8/1993 | Sebald et al. ................ 430/325 |
| 5,250,375 A | 10/1993 | Sebald et al. | |
| 5,275,920 A * | 1/1994 | Sezi et al. ................... 430/315 |
| 5,726,094 A * | 3/1998 | Schwalke et al. ........... 438/561 |
| 5,858,620 A | 1/1999 | Ishibashi et al. | |
| 6,054,254 A * | 4/2000 | Sato et al. ................... 430/322 |
| 6,124,081 A * | 9/2000 | Kishimura .................. 430/323 |

FOREIGN PATENT DOCUMENTS

| | | |
|---|---|---|
| DE | 42 36 609 A1 | 5/1994 |
| DE | 197 06 495 A1 | 1/1998 |
| EP | 0 238 690 A1 | 9/1987 |
| EP | 0 313 814 A2 | 5/1989 |
| EP | 0 395 917 A2 | 11/1990 |
| EP | 0 395 917 B1 | 11/1990 ............. G03F/7/40 |
| EP | 0 492 253 A1 | 7/1992 |

* cited by examiner

*Primary Examiner*—Nadine G. Norton
*Assistant Examiner*—Lynette T. Umez-Eronini
(74) *Attorney, Agent, or Firm*—Laurence A. Greenberg; Werner H. Stemer; Gregory L. Mayback

(57) ABSTRACT

The novel process lends itself to the production of highly resolved resist structures. A resist structure having webs is produced from a photoresist on a substrate and then the sidewalls of the webs are selectively chemically amplified so that chemically amplified sidewall structures are obtained. After the removal of the chemically unamplified sections, the amplified sidewall structures are transferred to the substrate. The process permits a resolution of structures that are not producible using the currently customary exposure wavelengths.

12 Claims, 3 Drawing Sheets

PROCESS FOR SIDEWALL AMPLIFICATION OF RESIST STRUCTURES AND FOR THE PRODUCTION OF STRUCTURES HAVING REDUCED STRUCTURE SIZE

BACKGROUND OF THE INVENTION

Field of the Invention

The invention relates to a process for the production of highly resolved resist structures and a process for structuring substrates.

In the semiconductor industry, increasingly small structures and hence an increasingly high density of components are being realized on microchips in shorter and shorter periods. Consequently, the computational speed of the processors and the storage volume of the memory elements are increasing while at the same time the cost of the components is decreasing. This reduction in the minimum structure size constantly presents new challenges to the chip manufacturers and their equipment suppliers. Optical lithography has to date mastered the challenges by changing over to increasingly short wavelengths. However, a substantial increase in cost is associated with the steady decrease in structure width and the modified exposure units required for this purpose. It is also critical that the exposure units and the associated photoresists be available in good time for the launch of a novel technology generation.

Photoresists are used in a variety of ways in numerous lithographic techniques in microelectronics. In general, a photoreaction is initiated in the photoresist by exposure to light and causes a change in the chemical structure of the photoresist. This finally results in a dramatic change in the solubility of the now exposed and chemically converted resist in a suitable developer medium.

In the case of the positive-working, chemically amplified resists, for example, the exposure liberates an acid which causes a catalytic conversion or cleavage of the resist in a postbake step. The strong acid eliminates acid-labile groups of the polymer. Polar groups are thereby liberated. Groups cleavable by strong acids are, for example, tert-butyl carboxylates, which are present as free carboxyl groups after acid cleavage. The change from a strongly nonpolar to a polar group results in a dramatic change in the solubility of the exposed and chemically modified resist in a suitable developer medium, such as, for example, an aqueous basic developer. In the case of positive-working resists, the substrate arranged under the photoresist is bare in the exposed parts after the development, whereas it is still covered by photoresists in the unexposed parts. In contrast to the positive resists, in negative resists the exposed part of the resist remains on the substrate. In the case of the chemically amplified negative resists, for example, the exposure liberates a strong acid which causes acid-catalyzed crosslinking of the resist polymers in the postbake step. Owing to the crosslinking, the exposed part becomes insoluble whereas the unexposed part can be removed in suitable (generally aqueous) developers. Alternatively, many positive-working chemically amplified resists can be used as negative resists if, after elimination of the protective groups, the chemically modified resist is developed not with an aqueous alkaline developer but with a nonpolar solvent. In this case, the nonpolar, chemically substantially unmodified resist parts are detached from the substrate. Such a process is described, for example, in U.S. Pat. No. 4,491,628.

The structured photoresists serve as a rule as a mask for further processes, such as, for example, dry etching processes, in order to structure a substrate present underneath, for example silicon dioxide or an organic chemical substrate. The structured photoresist must have higher etching resistance than the organic or inorganic substrate present under the structured photoresist. The etching resistance depends on the type of plasma used and on the composition of the photoresist. Thus, silicon-containing compounds are converted in the oxygen plasma into poorly volatile silicon oxide, whereas volatile silicon tetrafluoride is produced in the fluorine plasma. If the substrate to be structured in the dry etching process is an organic silicon-free layer, the etching resistance of the upper structured resist layer in the oxygen plasma can be substantially increased by the subsequent incorporation of organosilicon compounds into the resist structure. The incorporation of silicon-containing groups is often referred to as silylation. Such a process for subsequent amplification of resist structures is described, for example, in European patent EP 0 395 917 B1 and the corresponding U.S. Pat. Nos. 5,234,793 and 5,234,794.

With the exposure wavelengths of 248 and 193 nm currently used in optical lithography, it is possible to resolve critical structure sizes down to the neighborhood of 100 nm. Dense structures having smaller spacings are difficult to produce owing to the resolution limits imposed by the wavelength of the exposure radiation. Isolated or substantially isolated structures having a smaller structure size can be achieved by conventional lithographic methods, for example by overexposure of isolated resist structures or by subsequent reduction in size of holes or troughs in the structures by means of silylation or thermal flow. In addition, higher resolutions have been producible to date only by special methods, such as, for example, electron beam lithography, and by exposure to extreme ultraviolet radiation (157 nm and 13 nm, X-ray).

No resists with production capabilities are available to date for exposure to radiation having a wavelength of 157 or 13 nm. In order to be able to produce dense structures, for example comprising lines and troughs, with structure sizes below 100 nm, attempts are being made in the semiconductor industry to reduce the exposure wavelength further. The achievable smallest structures are proportional to the exposure wavelength. However, this also requires the development of novel apparatuses, for example of exposure units, in addition to development of transparent resists.

SUMMARY OF THE INVENTION

It is accordingly an object of the invention to provide a process for producing highly resolved resist structures which overcomes the above-mentioned disadvantages of the heretofore-known devices and methods of this general type and which renders it possible to resolve structures having a critical structure size of less than 100 nm even with the currently conventional exposure wavelengths of 248 nm or 193 nm.

With the foregoing and other objects in view there is provided, in accordance with the invention, a process for producing highly resolved resist structures, which comprises the following steps:

applying a resist film to a substrate;

producing a resist structure with webs from the resist film, the webs having sidewall structures chemically amplified in a dry etching resistance thereof and sections disposed between the sidewall structures that are not chemically amplified in a dry etching resistance thereof; and removing the sections that are not chemically amplified in their dry etching resistance.

In other words, the objects of the invention are achieved by a process for the production of highly resolved resist structures, a resist film being applied to a substrate, a resist structure having webs being produced from the resist film, which webs comprise sidewall structures chemically amplified in their dry etching resistance and sections which are arranged between the sidewall structures chemically amplified in their dry etching resistance and which are not chemically amplified in their dry etching resistance, and the sections which are not chemically amplified in their dry etching resistance being removed.

The process according to the invention uses a selective chemical modification of sections of webs which are produced from a resist film. Through the chemical modification, it is possible to achieve a differentiation between amplified and unamplified sections of the webs, with the result that, for example, different etching stability of the sections in an etching plasma is produced. The degree and in particular the extent of the chemically amplified sidewall structures can be very accurately controlled by the reaction conditions. Thus, the extent of the sidewall structures can be influenced, for example, by the reaction time, the reaction temperature or the concentration and type of amplification reagent. By means of the process according to the invention, it is possible to resolve structures which are substantially below the resolution limit of the currently used exposure wavelengths of 248 or 193 nm. Using the exposure methods and units customary today, it is thus possible to produce structures which in some cases have even smaller dimensions than are possible by using an exposure wavelength of 157 nm. In the context of the invention, webs are understood generally as meaning raised resist structures which are arranged, for example, on a wafer.

The sidewall structures chemically amplified in their dry etching resistance can be produced by various processes. According to a first preferred embodiment, a resist film comprising a chemically amplifiable photoresist is applied to a substrate and the resist film is subjected to section-by-section exposure, heating and development for structuring so that a structured resist which has webs having sidewalls and a top layer is obtained. The sidewalls are amplified by means of an amplification agent to give a resist structure which has webs with chemically amplified sidewall structures and chemically unamplified sections arranged between the chemically amplified sidewall structures. The chemically unamplified sections of the webs are then removed, for example by a selective etching method.

In order to achieve chemical amplification of the sidewall structures, the photoresist preferably has reactive groups to which the amplification agent can be linked. Chemically amplified positive resists contain, for example, a polymer which has acid-labile groups which are bonded to a polar group, for example a carboxyl group or hydroxyl group. After elimination of the acid-labile group, the polar group is liberated and can be used as an anchor group for linkage of an amplification agent. If the polar group has acidic character, such as, for example, a carboxyl group or an acidic hydroxyl group, the amplification agent must have a basic linkage group, which is then bonded to the anchor group of the resist, for example by formation of an ammonium salt. Other interactions are also possible. For example, the amplification agent can also be bonded to the resist by dipole-dipole interactions or a covalent bond. Thus, isocyanate- or epoxide-containing agents may be linked to hydroxyl groups in the resist polymer for increasing the dry etching resistance. In a further variant (RELACS™ process), the structure expansion is effected by polymerizing on reactive components, preferably on the surface of the partially exposed parts. With the use of etching-resistant expansion components, selective sidewall amplification can be achieved here too. The polymer of the photoresist can also comprise reactive anchor groups. Reactive anchor groups are understood as meaning anchor groups which can react with the amplification agent even without pretreatment, such as the above-described elimination of acid-labile radicals. Such a reactive anchor group is, for example, a carboxylic anhydride group, an alcohol group, an epoxide group, a glycidyl ether or a ketene group. A particularly preferably used reactive anchor group is a carboxylic anhydride group, which can be introduced into the polymer, for example, by copolymerization of unsaturated carboxylic anhydrides. Exemplary unsaturated carboxylic anhydrides are maleic anhydride, cyclohexene dicarboxylic anhydride or norbornene-dicarboxylic anhydride. Such chemically amplifiable photoresists are described, for example, in the above-mentioned EP 0 395 917 B1, U.S. Pat. Nos. 5,234,793 and 5,234,794.

For selective chemical amplification of the sidewall structures, it is possible to make use of the effect that the amplification reaction takes place more rapidly at the interface between exposed and unexposed sections than in unexposed sections of the photoresist. At a web of the structured resist, the lateral surfaces correspond to the interfaces between exposed and unexposed sections of the photoresist and the top layer corresponds to the unexposed part of the photoresist. The increased reactivity of the sidewalls is due to the fact that these parts contain polymer chains in which even acid-labile groups were eliminated by the action of the acid liberated from the photo acid generator, although the polarity of the polymer chain has not yet increased to a sufficient extent for solubility in the developer. The polar groups present on the sidewalls can then be used as anchor groups for linkage of the amplification agent. The effect can be further increased by the choice of a suitable solvent system for the amplification agent. The top layer, which corresponds to the unexposed resist surface and has no liberated polar groups, is substantially more nonpolar than the sidewalls of the web. With the use of a polar solvent, such as hexanol or isopropanol, to which a swelling promoter may optionally have been added, such as water, low molecular weight alcohols, such as methanol or ethanol, or low molecular weight ketones, such as acetone, the top layer is scarcely dissolved, and it is also for this reason that no amplification agent can penetrate into the top layer. In contrast, the sidewall is partially swollen, with the result that penetration of the amplification agent is possible. The amplification agent can then react with the anchor groups of the polymer which are formed either from the polar groups of the polymer or especially provided reactive anchor groups, with the result that selective chemical amplification of the sidewalls in their dry etching resistance is achieved.

In general, no complete differentiation in the solubility or the swelling of the sidewalls and of the top layer can be achieved. The amplification agent therefore also reacts to a small extent with the top layer of the web, which leads to the formation of a thin amplified top layer. A short plasma step in which the chemically amplified top layer is removed is therefore advantageously carried out before the removal of the unamplified parts of the photoresist which are arranged between the sidewalls. A plasma change is then carried out, so that the chemically unamplified parts of the web which are arranged between the sidewall structures can be selectively removed.

Particularly for the production of thicker chemically amplified sidewall structures, a second preferred embodiment comprises a procedure in which the top layer of the webs is chemically amplified together with the sidewalls, so that a chemically amplified top layer is obtained, and the chemically amplified top layer is then selectively removed. For removal of the chemically amplified top layer, a first dry etching step which is as short as possible is carried out before the chemically unamplified parts are removed in the actual dry etching step. The plasma change required for this purpose, for example from a fluorine plasma to an oxygen plasma, can be readily controlled using the customary installations for dry development.

An important aspect of this embodiment is that a part of the photoresist remains in the core of the web, which part is not chemically amplified. After the removal of the top layer, which is achieved, for example, by brief plasma etching, this chemically unamplified part of the photoresist is bared and can be removed in a further plasma step which has a high selectivity with respect to the sidewall structures. In this case, too, chemically amplified sidewall structures whose critical structure size is substantially below the resolution limit of the currently used exposure radiation are obtained.

In a further preferred embodiment of the process according to the invention, the different swellability of exposed and unexposed photoresists is also utilized for achieving selective chemical amplification of the sidewalls of a web. A resist film comprising a chemically amplified photoresist is produced and the resist film is exposed and heated section by section. A developer solution which contains an amplification agent is applied to the exposed and heated resist film so that unexposed sections of the resist film are detached from the substrate and exposed sections of the photoresist remain on the substrate. Chemically amplified sidewall structures are thus produced in a section of the photoresist, between exposed and unexposed parts of the photoresist.

In this embodiment of the process according to the invention, the development and the amplification of the positive resist are carried out simultaneously. For this purpose, for example, a chemically amplified positive resist is first applied to the substrate so that a resist film is obtained. The resist film is exposed and heated section by section so that a strong acid is liberated in the exposed parts, which acid results in catalytic elimination of the acid-labile groups from the polymer. The photoresist now has a polar character in the exposed parts whereas it has a nonpolar character in the unexposed parts. A developer solution which contains an amplification agent is applied to the exposed and heated resist film. The developer solution comprises a nonpolar solvent, so that only the unexposed parts of the photoresist which have a nonpolar character are selectively detached from the substrate. The photoresist thus acts as a negative resist in this embodiment.

Nonpolar or weakly polar solvents are used as solvents for the developer. All customary aliphatic, cycloaliphatic and aromatic solvents, and alcohols, aldehydes, ketones, lactones or esters of low polarity and mixtures of those solvents are suitable. A preferred solvent is, for example, hexanol. The solvents must take up the components of the developer in an emulsion or preferably in a clear, homogeneous and storage-stable solution and may not react with the anchor groups present on the polymer or with the amplification agent.

For selective amplification of the sidewall structures, a difference in the polarity of the top layer and of the sidewalls of the structured resist is once again utilized. The sidewalls of the-resulting web have a lower polarity than the top layer. Since a nonpolar solvent is used as a developer in this embodiment of the process, the sidewalls can now be swollen so that the amplification agent can penetrate, whereas the top layer, which has a high polarity, is not swollen by the solvent and is therefore not amplified or amplified only to a small extent.

The formation of the sidewall structures chemically amplified in their dry etching resistance is preferably followed by a short plasma process in which chemically amplified sections of the top layer are removed. Those chemically unamplified sections of the webs which are arranged between the sidewall structures are then selectively removed in a further plasma step.

In principle, the described process of the third embodiment can also be carried out by chemically amplifying both sidewalls and top layer. This can be achieved, for example, by adding a swelling promoter, for example water or lower alcohols, to the developer solution. The process must then be carried out in such a way that a core of chemically unamplified photoresist still remains in the center of the web. The top layer is then once again removed in a first plasma process, so that the chemically unamplified core is bared. The photoresist material arranged between the chemically amplified sidewall structures is then selectively removed in a second plasma step.

In a fourth embodiment of the process according to the invention, a multilayer resist film is used, so that a differentiation between top layer and sidewalls of the webs of the structured resist is achieved by the build-up of the resist layers.

For this purpose, a resist film is produced on the substrate by applying a first resist layer of a chemically amplifiable resist to the substrate and producing, on the first resist layer, a second resist layer of a chemically amplified photoresist which has no free anchor groups for chemical amplification. The upper, second resist layer is thus photosensitive but cannot be chemically amplified, whereas the lower, first resist layer is not changed during an exposure but has anchor groups for chemical amplification.

The resist film is subjected to section-by-section exposure, heating and development, so that exposed parts of the second (upper) resist layer are removed and bared parts are obtained. The first resist layer is removed in the bared parts, webs having sidewalls of the material of the first resist layer being obtained. The removal of the first resist layer in the bared parts can be carried out, for example, using a selective plasma process. The sidewalls are chemically amplified by means of an amplification agent, so that chemically amplified sidewall structures are obtained. The upper second resist layer and the sections which are arranged between the chemically amplified sidewall structures of the first resist layer and were not chemically amplified are then removed in a selective plasma process.

In this embodiment of the process, a polymer or a photoresist having substantially lower sensitivity compared with the second resist layer is preferably used as the first resist layer if the structuring of the first resist layer is to be carried out in a plasma step. If the structuring of the first resist layer is carried out during the aqueous development itself, both resist layers must have at least a similar sensitivity.

First and second resist layers can be produced per se directly one on top of the other. However, it must be ensured that there is no mixing of the resist layers when the second resist layer is applied on the first resist layer. In an advantageous embodiment, an intermediate layer is therefore provided between first resist layer and second resist layer, by means of which intermediate layer mixing of first and second resist layer is prevented. Such an intermediate layer may be produced, for example, from sputtered material, in particular a carbon layer. Such an intermediate layer has the further advantage that it optically isolates the lower first resist layer from the upper second resist layer. Therefore, no light penetrates into the first resist layer during exposure. A chemically amplified photoresist can therefore likewise be used as the first resist layer.

In accordance with an advantageous feature of the invention, the resist film can be produced directly on the substrate. However, a layer of a bottom resist is advantageously provided between substrate and resist film. For example, a novolac layer can be used as the bottom resist. Irregularities of the substrate surface which are caused, for example, by components already integrated are compensated by the layer of the bottom resist. Furthermore, difficulties which are caused by the small depth of focus at short exposure wavelengths are thus avoided.

The amplification agent preferably comprises silicon-containing groups. For example, diaminosiloxanes are suitable. The amplification gives sidewall structures which have high etching resistance in the oxygen plasma. Consequently, sections of the photoresist which have no silicon-containing groups can be extremely selectively removed. Furthermore, a top layer which is formed, on a web during the, chemical amplification can be selectively removed by a short treatment with an anisotropic fluorine plasma. The amplification agent is preferably at least bifunctional, i.e. it contains at least two linkage groups. This permits crosslinking of the resist in the amplified sidewall structures and hence a further increase in the stability of these structures.

According to a further embodiment of the process according to the invention, the resist film is formed from a positively amplified photoresist which comprises a photo acid generator. After the structuring of the resist film, a monomer capable of undergoing acid-catalyzed polymerization is applied to the structured resist. This is preferably effected by applying a solution of the monomer to the structured resist. The structured resist is then heated together with the solution of the monomer so that acid formed from the photo acid generator diffuses to the sidewalls of the webs, and the monomer capable of undergoing acid-catalyzed polymerization polymerizes under the influence of the acid, sidewall structures chemically amplified in their dry etching resistance being formed on the sidewalls. Preferably used monomers capable of undergoing acid-catalyzed polymerization are epoxide-containing compounds which contain groups which increase the etching stability, for example aromatic, cycloaliphatic or silicon-containing groups.

The process according to the invention permits the production of highly resolved resist structures. These resist structures can be used for selectively structuring a substrate in a plasma etching process. The substrate used may be, for example, a silicon wafer in which components may already have been integrated or which is covered, for example, with a layer of silicon dioxide.

With the above and other objects in view there is also provided, in accordance with the invention, a method of structuring a substrate, which comprises the steps of producing a highly resolved resist structure with the process outlined in the foregoing, and transferring the highly resolved resist structure to the substrate.

That is, the invention also relates to a process for structuring substrates, a highly resolved resist structure being produced by the process described above, and the highly resolved resist structure produced being transferred to the substrate.

The highly resolved resist structure is preferably transferred to the substrate by plasma etching. An anisotropic plasma is preferably used for the plasma etching.

Other features which are considered as characteristic for the invention are set forth in the appended claims.

Although the invention is illustrated and described herein as embodied in a process for sidewall amplification of resist structures and for the production of structures having reduced structure size, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
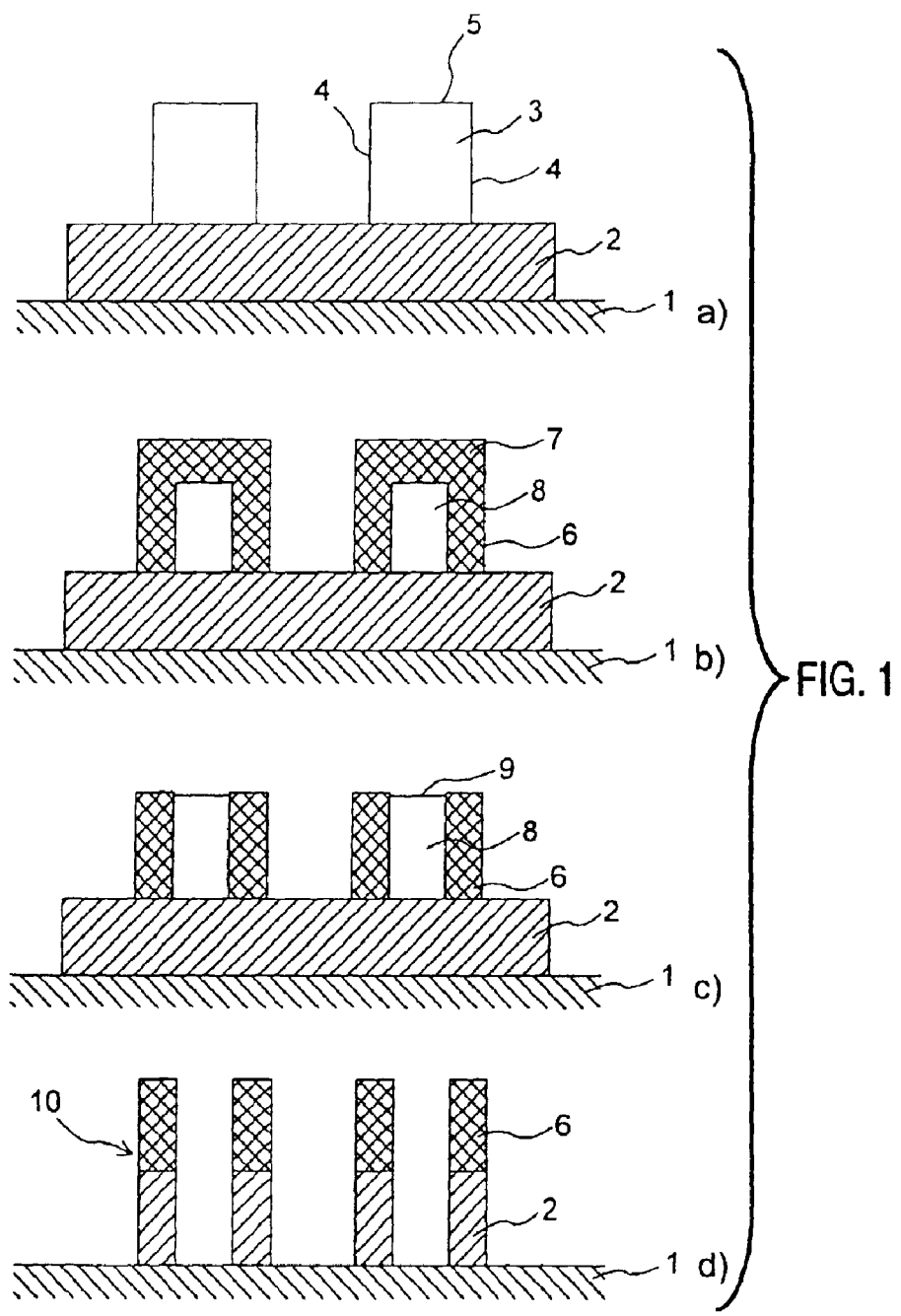
FIG. 1 is a series of diagrammatic sectional side views illustrating a sequence of process steps taking place in the first or second embodiment of the process according to the invention.

Referring now to the figures of the drawing in detail and first, particularly, to FIG. 1 thereof, there is shown a process sequence in which a bottom resist, for example a novolac or an antireflection coating, is first applied to a substrate. The substrate, by way of example, is a silicon wafer or a silicon dioxide layer, A layer of a chemically amplified photoresist is applied on the bottom resist. The photoresist used may be, for example, a photoresist as described in EP 0 395 917 B1, U.S. Pat. No. 5,234,793 and U.S. Pat. No. 5,234,794. In addition to a photo acid, the photoresist contains a polymer which is obtained by copolymerization of unsaturated carboxylic anhydrides and unsaturated monomers which comprise an acid-labile group. The polymer then contains reactive anchor groups which are formed by carboxylic anhydride groups, and acid-labile groups which are derived, for example, from tert-butyl methacrylate. The photoresist is then exposed and developed in a known manner. After the development, a resist structure as shown in FIG. 1(a) is obtained. A layer of a bottom resist 2 is applied to a substrate 1, on which bottom resist in turn webs 3 which are formed from the photoresist are arranged. The webs comprise sidewalls 4 and a top layer 5. A solution of the amplification agent is now applied to the structure shown in cross section in FIG. 1. The solution can be applied, for example, in a spray, puddle or immersion process. The amplification agent comes into contact with the bared outer surfaces of the webs 3 and can react there with the anchor groups of the polymer which is a component of the photoresist. Depending on the reaction, selective amplification of the sidewalls 4 or unspecific amplification of all outer surfaces can be achieved.

FIG. 1(b) shows the state which is obtained in the case of unspecific chemical amplification of all outer surfaces of the webs 3. The outer surfaces of the webs 3 are swollen by the solvent of the amplification solution, so that the amplification agent can penetrate into the outer parts of the web 3 and can react there with the anchor groups of the polymer. The depth of penetration can be controlled, for example, by the type of solvent, the concentration of the amplification agent, the duration of reaction or the reaction temperature. Amplified sidewall structures 6 form on the sidewalls of the web 3 and a top layer 7, which is likewise amplified, forms on the upper surface of the web 3. In the interior of the web 3 is a core 8 comprising a photoresist which was not chemically amplified. In FIG. 1(b), the amplified sidewall structures 6 and the amplified top layer 7 have the same layer thickness. In general, however, the reaction can be carried out in such a way that the amplified sidewall structures 6 have a considerably greater layer thickness than the amplified top layer 7. In a reaction in which the chemically amplified sidewall structures 6 are specifically formed, the amplified top layer 7 is only very thin or is not present.

For the removal of the amplified top layer 7, a short plasma process is now carried out. If chemical amplification was carried out by incorporation of silicon-containing groups, for example, a fluorine plasma can be used for this purpose. The fluorine plasma acts anisotropically, so that only the horizontally arranged amplified top layer 7 is selectively removed. This results in a state as shown in FIG. 1(c). The webs arranged on the bottom resist 2 now have a surface 9 in whose center the core 8 is bare and is surrounded by an edge, which is formed by the chemically amplified sidewall structures 6. The core 8 and the sidewall structures 6 differ in their etching stability, for example with respect to an oxygen plasma. The core 8 arranged between the sidewall structures 6 can therefore be selectively removed by the action of an anisotropic oxygen plasma. At the same time, those parts of the bottom resist 2 which are not covered by the chemically amplified sidewall structures 6 are also removed. The bottom resist 2 is removed down to the substrate 1 in the sections which are not covered by the amplified sidewall structures 6. The resulting state is shown in FIG. 1(d). Highly resolved resist structures 10 are obtained which consist, in their upper section, of the amplified sidewall structures 6 and, in their lower parts, of the remaining parts of the bottom resist 2. The structure can now be transferred to the substrate 1 by a selective etching process, uncovered parts of the substrate 1 being removed.

Figure 2:
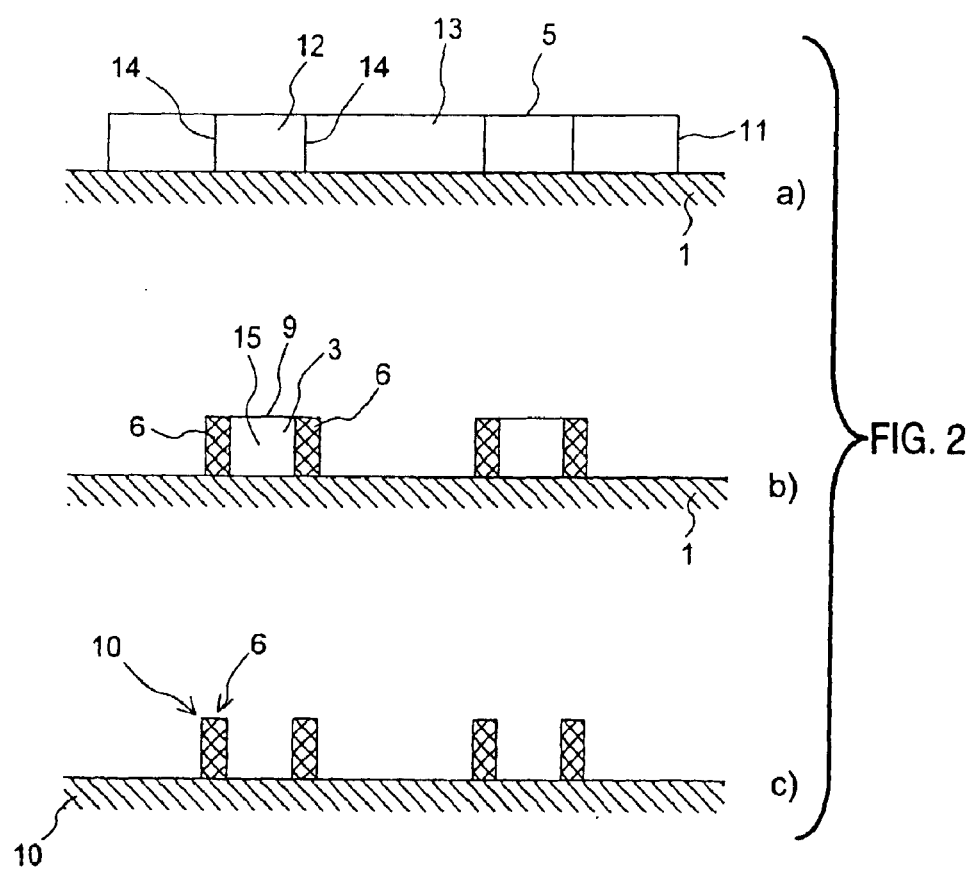
FIG. 2 illustrates various process steps that take place in the third embodiment of the process.

FIG. 2 shows process steps of an embodiment of the process according to the invention, in which the amplification of the sidewall structures is effected simultaneously with the development of the photoresist.

First, a photoresist is applied to a substrate, exposed and heated as in the process described with reference to FIG. 1. The photoresist used may once again be a positive resist, as described in EP 0 395 017 B1, U.S. Pat. No. 5,234,793 and U.S. Pat. No. 5,234,794. In the exposed parts, the acid-labile groups are eliminated from the polymer by the acid liberated, thus increasing the polar character of the resist. This state is shown in the subfigure FIG. 2(a). A resist layer 11 which has exposed sections 12 and unexposed sections 13 is arranged on a substrate 1. In each case a boundary layer 14 which still contains polymers in which only some of the acid-labile groups have been eliminated is arranged between the exposed sections 12 and the unexposed sections 13. The exposed sections 12 have high polarity, whereas the unexposed sections 13 have low polarity.

An amplification solution in which an amplification agent is dissolved in a nonpolar solvent is now added to the resist layer 11. The unexposed sections 13 are detached from the substrate 1 by the nonpolar solvent, while webs 3 form from the exposed sections 12. By removing the unexposed sections 13, the boundary layers 14 are accessible to the amplification agent and the solvent. The boundary layer 14, which has a lower polarity than the exposed section 12, is swollen by the nonpolar solvent so that amplification agent can penetrate into the boundary layer 14 and can be bound there in the photoresist. The top layer 5 of the exposed parts 12 has high polarity and therefore cannot be swollen by the solvent of the amplification agent. There is therefore no chemical amplification or only slight chemical amplification on the top layer 5.

The state after the development and selective amplification is shown in FIG. 2(b). Webs 3 which have sidewall structures 6 amplified on the lateral surfaces are arranged on the substrate 1, a chemically unamplified section 15 whose surface 9 is bare being arranged between the amplified sidewall structures 6. The chemically unamplified section 15 can now be selectively removed. For example, an oxygen plasma can be used for this purpose or the chemically unamplified section 15 is detached using a polar solvent, for example water, to which an alkaline substance has been added. A state as shown in FIG. 2(c) is obtained. Highly resolved resist structures 10 which are formed by the chemically amplified sidewall structures 6 are arranged on the substrate 1. Finally, transfer of the highly resolved resist structures 10 to the substrate 1 is once again carried out as in the process shown in FIG. 1.

Sidewall profiles chemically amplified in their dry etching resistance can alternatively also be produced with resists having crosslinking polymers which can be chemically amplified. In the boundary layer 14, the resist exhibits less crosslinking than in the exposed sections 12. This difference in the crosslinking in turn results in different swelling capability of the solvent of the amplification agent and hence selective production of sidewall structures 6.

Figure 3:
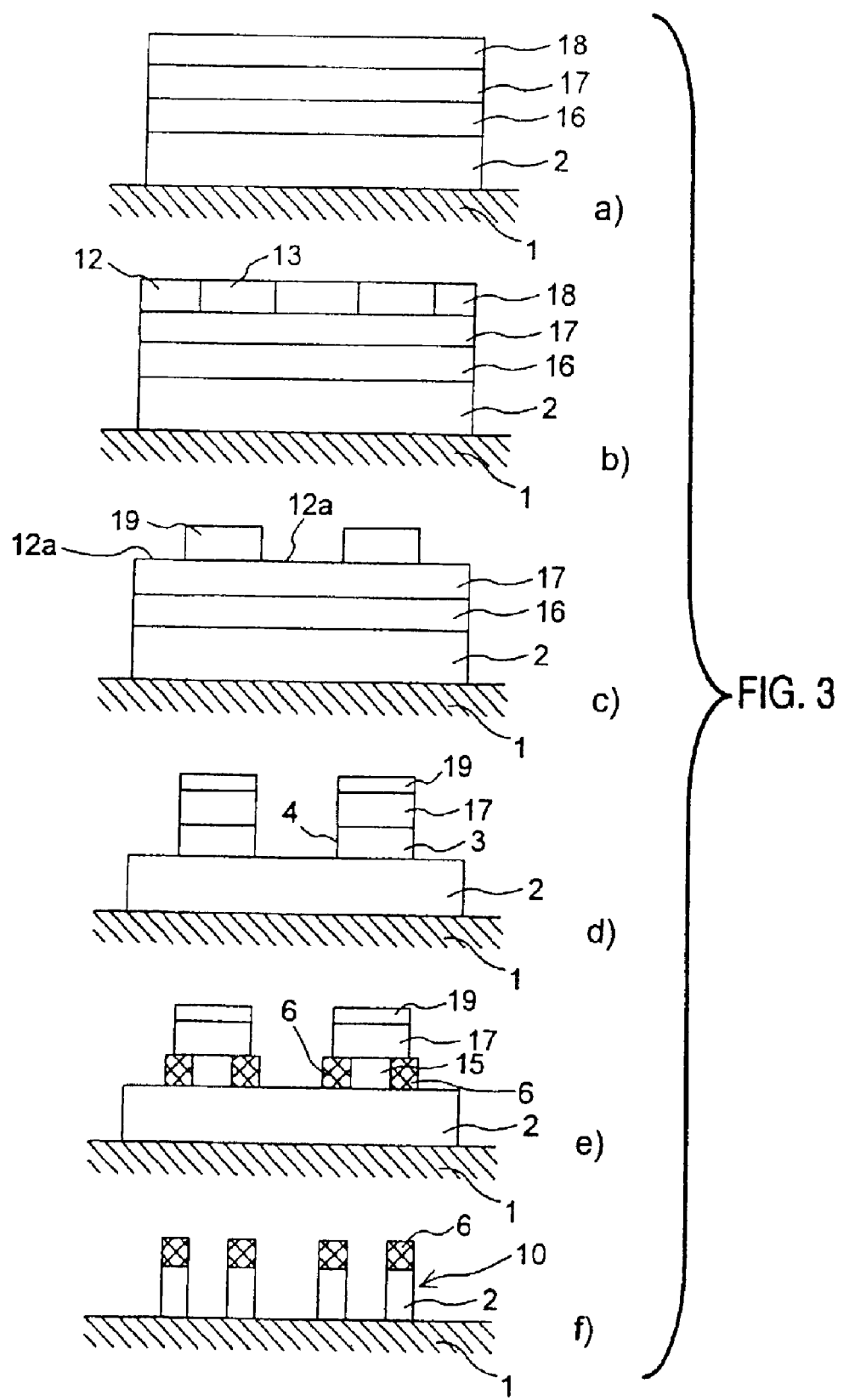
FIG. 3 illustrates various process stages that take place in a procedure according to the fourth embodiment of the process.

FIG. 3 shows process steps which take place when carrying out the process according to the invention with a multilayer resist film. The process starts from a layer structure which is shown in FIG. 3(a). A bottom resist 2, which consists, for example, of a novolac is arranged on a substrate 1. A first resist layer 16 which may be chemically amplified is arranged on the bottom resist 2. The first resist layer 16 generally contains no photoactive compounds, so that it is not chemically modified under the action of exposure radiation. For example, carboxylic anhydride groups, carboxyl groups or hydroxyl groups may be provided in the polymer of the photoresist as anchor groups for linking the amplification agent. An intermediate layer 17 is provided on the first resist layer 16. Said intermediate layer consists, for example, of a sputtered material, for example carbon, silicon, silicon oxide or silicon nitride. A second resist layer 18 which is photosensitive is applied to the intermediate layer 17. The second resist layer contains no reactive anchor groups, so that it cannot be chemically amplified without prior activation.

The layer structure shown in FIG. 3(a) is now exposed and heated in a customary manner, a state as shown in FIG. 3(b) being obtained. As a result of the exposure, a chemical profile which comprises exposed sections 12 and unexposed sections 13 has been produced in the second resist layer 18.

The layers 2, 16 and 17 arranged under the second resist layer 18 have not been modified in their chemical composition by the exposure. The second resist layer 18 is then developed in a customary manner. For this purpose, a developer solution, for example an aqueous alkaline developer solution, is added to the layer structure shown in FIG. 3b so that the exposed parts 12 are detached. Webs 19 form from the unexposed parts 13, as shown in FIG. 3(c). The layers 2, 16 and 17 still remain unchanged. By means of a plasma etching process, the structure produced by the webs 19 is transferred to the layers 16 and 17. This state is shown in FIG. 3(d). Webs 3 which are formed from the chemically amplifiable material of the first resist layer 16 are arranged on the bottom resist 2. The corresponding sections of the intermediate layer 17 and the webs 19 obtained from the second resist layer 18 are arranged as a top layer on the webs 3. The sidewalls 4 of the webs 3 are bare and are therefore accessible to a chemical amplification agent. A solution of an amplification agent is now added to the layer structure shown in FIG. 3(d). The sidewalls 4 of the webs 3 are swollen by the solvent so that amplification agent can penetrate and can be bound to the polymer of the photoresist. After the amplification, excess amplification agent is removed. A state as shown in FIG. 3(e) is obtained. The sidewalls 4 of the web 3 have been chemically amplified, so that amplified sidewall structures 6 are obtained. Since no chemical amplification has taken place in the sections obtained from the intermediate layer 17 and in the web 19, the amplified sidewall structures 6 project beyond sections 17 and 19. Once again, a chemically unamplified section 15 is arranged between the amplified sidewall structures 6. The webs 19 and the sections 17 are now removed by plasma etching so that the chemically unamplified section 15 is bared. Thereafter, the chemically unamplified sections 15 are selectively removed and the amplified sidewall structures 6 are transferred to the bottom resist 2 by etching. Highly resolved resist structures 10, as shown in FIG. 3(f), are obtained. The upper section of the highly resolved resist structures is formed from the chemically amplified sidewall structures 6, while the lower section is formed from the bottom resist 2. Finally, as in the processes described in connection with FIG. 1 and 2, the structure formed from the highly resolved resist structures is transferred to the substrate 1 by plasma etching.

In order to obtain stable, highly resolved resist structures 10, resists having a high glass transition temperature (Tg) are preferably used in all processes according to the invention, since in some cases very soft and therefore unstable structures form by incorporation of silicon-containing groups during the amplification. Alternatively, amplification with aromatic groups is possible. If the sidewall amplification is carried out in a silylation reaction, a bottom resist 2 is generally required. The structure is transferred first to the bottom resist 2 and only thereafter to the substrate 1. On the other hand, aromatization requires substantially thicker structurable layers since the differences in etching resistance between the resists amplified by aromatic groups and the chemically unamplified sections are only comparatively small. An advantage here is that no bottom resist is required owing to the substantial differences in the etching resistance relative to the substrate.

We claim:

1. A process for producing highly resolved resist structures, which comprises the following steps:
    applying a resist film to a substrate;
    producing a resist structure with web from the resist film, the web having sidewall structures and sections disposed between the sidewall structures, the sidewall structures having a chemically amplified dry etching resistance and the sections having a chemically unamplified dry etching resistance; and
    removing the sections.

2. The process according to claim 1, which comprises:
    subjecting the resist film, applied to the substrate and including a chemically amplifiable photoresist, to section-by-section exposure, heat, and development for structuring the resist film to obtain a structured resist with web having sidewalls and a top layer; and
    chemically amplifying the dry etching resistance of the sidewalls with an amplification agent to produce the resist structure having web with the chemically amplified sidewall structures and the chemically unamplified sections between the sidewall structures.

3. The process according to claim 2, which comprises chemically amplifying the top layer of the web together with the sidewall structures, to obtain a top layer with chemically amplified dry etching resistance, and selectively removing the top layer.

4. The process according to claim 1, which comprises:
    producing the resist film including a chemically amplified photoresist on a substrate;
    subjecting the resist film to section-by-section exposure and heating; and
    applying a developer solution containing an amplification agent for increasing the dry etching resistance to the exposed and heated resist film such that unexposed sections of the resist film are detached from the substrate and exposed sections of the photoresist remain on the substrate, whereby sidewall structures having chemically amplified dry etching resistance are produced in a section of the photoresist between exposed and unexposed parts of the photoresist.

5. The process according to claim 4, which comprises chemically amplifying a top layer of the unexposed parts of the photoresist in addition to the section of the photoresist between exposed and unexposed sections of the photoresist, and removing the top layer.

6. The process according to claim 1, which comprises:
    producing the resist film on the substrate by applying a first resist layer formed of a chemically amplified resist to the substrate and applying a second resist layer formed of a chemically amplified photoresist having no anchor groups for chemical amplification to the first resist layer;
    subjecting the resist film to section-by-section exposure, heating and developing, such that exposed parts of the second resist layer are removed and bared parts are obtained;
    removing the first resist layer in the bared parts, whereby sidewalls of the first resist layer are obtained; and
    chemically amplifying the dry etching resistance of the sidewalls with an amplification agent to obtain sidewall structures having chemically amplified dry etching resistance.

7. The process according to claim 6, which comprises forming an intermediate layer between the first resist layer and the second resist layer, to prevent a mixing of the first resist layer and the second resist layer.

8. The process according to claim 1, which comprises forming a layer of a bottom resist between the substrate and the resist film.

9. The process according to claim 1, wherein the amplification agent comprises silicon-containing groups.

10. The process according to claim 2, which comprises:
    forming the resist film from a positively amplified photoresist containing a photo acid generator; and after structuring of the resist film, applying a monomer capable of undergoing acid-catalyzed polymerization to the structured resist;

heating the structured resist so that acid formed from the photo acid generator diffuses to the sidewalls of the web; and polymerizing the monomer capable of undergoing acid-catalyzed polymerization under influence of the acid, whereby sidewall structures having chemically amplified dry etching resistance are formed on the sidewalls.

11. A method of structuring a substrate, which comprises producing a highly resolved resist structure with the process according to claim 1, and transferring the highly resolved resist structure to the substrate.

12. The method according to claim 11, wherein the transferring step comprises transferring the highly resolved resist structure to the substrate by plasma etching.

* * * * *